United States Patent [19]

Nilarp

[11] Patent Number: 4,563,698
[45] Date of Patent: Jan. 7, 1986

[54] SCR HAVING MULTIPLE GATES AND PHOSPHORUS GETTERING EXTERIORLY OF A RING GATE

[75] Inventor: Anders Nilarp, Rancho Palos Verdes, Calif.

[73] Assignee: International Rectifier Corporation, Los Angeles, Calif.

[21] Appl. No.: 407,425

[22] Filed: Aug. 12, 1982

[51] Int. Cl.$^4$ ............ H01L 27/24; H01L 29/08; H01L 29/06; H01L 29/44
[52] U.S. Cl. ............................. 357/38; 357/86; 357/68; 357/78
[58] Field of Search ............ 357/68, 86, 64, 78, 357/38, 20, 39

[56] References Cited

U.S. PATENT DOCUMENTS 4,195,306  3/1980  Fullmann et al. ............ 357/38

FOREIGN PATENT DOCUMENTS 1209211  1/1966  Fed. Rep. of Germany .... 357/38 C
2246979  4/1974  Fed. Rep. of Germany .... 357/38 C
0122166  9/1981  Japan ............ 357/38 A
1015993  1/1966  United Kingdom ............ 357/38 C Primary Examiner—Martin H. Edlow
Assistant Examiner—S. V. Clark
Attorney, Agent, or Firm—Ostrolenk, Faber, Gerb & Soffen

[57] ABSTRACT

A controlled rectifier employing a ring gate and an auxiliary emitter is disclosed. Auxiliary gates of different sensitivity cooperate with the auxiliary emitter. The controlled rectifier has gallium-diffused junctions and a phosphorus-diffused emitter. Phosphorus gettering dots or rings are diffused into the gallium-diffused region at the upper surface of the device surrounding and beneath portions of the ring gate electrode. The ring gate electrode has a narrow finger which extends from its internal periphery and overlaps a narrow extension from the main central emitter in order to provide a non-injecting current path for the peripheral distributed capacitance current which flows during the application of forward voltage. The value of this current is proportional to the rate of application of voltage or dV/dt.

12 Claims, 7 Drawing Figures

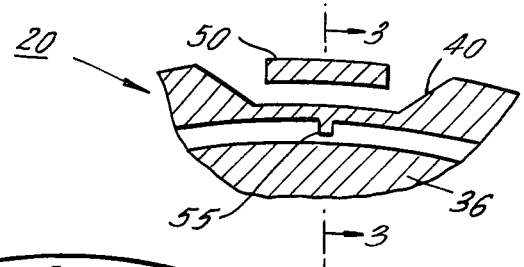
FIG. 1a.
FIG. 1.
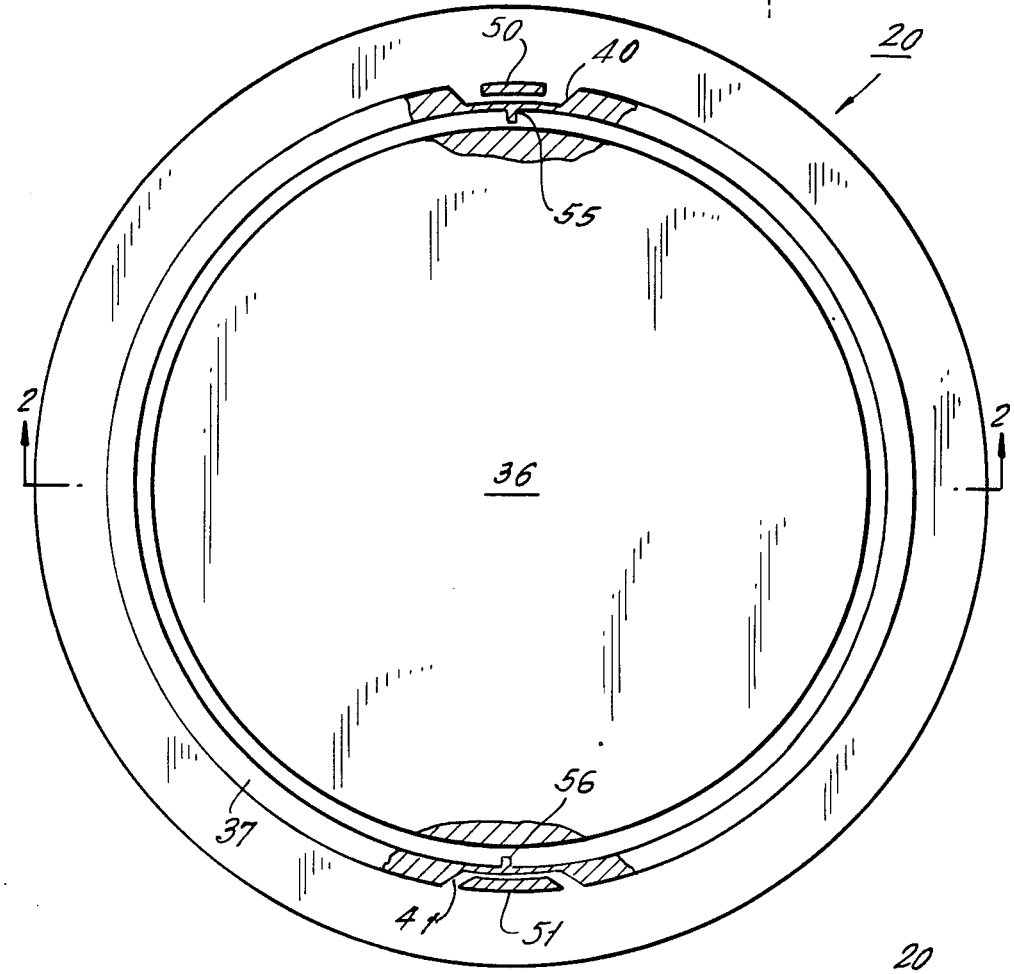
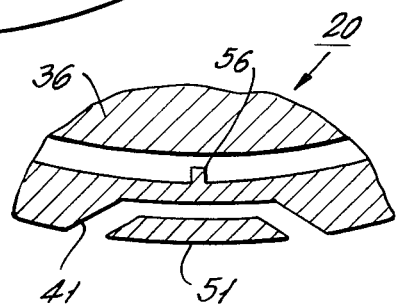
FIG. 1b.

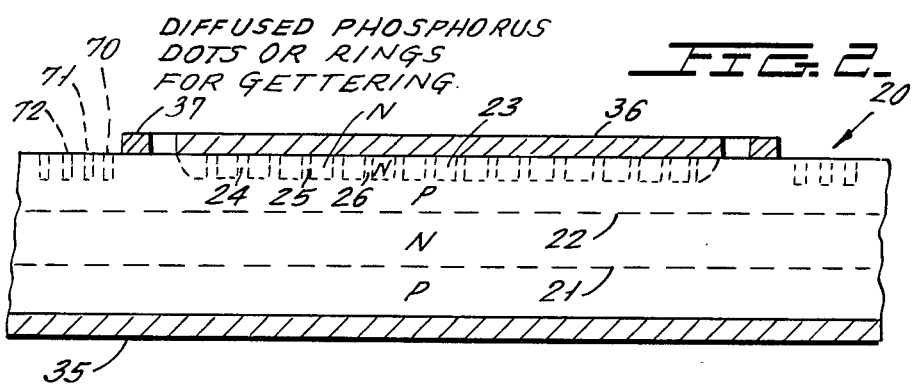

SCR HAVING MULTIPLE GATES AND PHOSPHORUS GETTERING EXTERIORLY OF A RING GATE

RELATED APPLICATIONS

This application is related to co-pending application Ser. No. 407,435, filed Aug. 12, 1982, entitled "Controlled Rectifier Having Ring Gate with Internal Protrusion for dV/dt Control" in the name of John Gault.

BACKGROUND OF THE INVENTION

This invention relates to controlled rectifiers employing ring gates and more specifically relates to a novel structure which permits selection of gate sensitivity and to a novel gettering structure for reducing leakage currents and improving blocking characteristics.

Controlled rectifiers employing an auxiliary cathode to permit firing of the device from a very low input gate current are well known and are shown, for example, in U.S. Pat. No. 3,586,827 in the names of Thomas J. Roach and James H. Hauck, and assigned to the assignee of the present invention.

Controlled rectifiers employing a ring gate are also well known. Devices of this type can employ an auxiliary cathode region. A portion of the ring gate acts as an auxiliary cathode of an auxiliary controlled rectifier, as well as the main gate for firing a main emitter region contained within the periphery of the ring gate. An auxiliary gate is commonly provided laterally exteriorly of the auxiliary emitter region and is partially covered by the ring gate.

Once the geometry of the auxiliary gate is fixed relative to the auxiliary emitter and portions of the ring gate, the sensitivity of the device is also fixed. The spacing between the auxiliary gate and certain portions of the ring gate determines the sensitivity of the device. That is to say, when the auxiliary gate is very close to certain portions of the ring gate, the sensitivity to turn-on is very low. If, however, greater spacing is used, the device is more sensitive. In present devices, once the device structure is completed, gate sensitivity is fixed and cannot be altered.

It is also known that phosphorus can be used as a getter for impurities and defects in silicon and thus will increase the lifetime of minority carriers in the device. However, phosphorus gettering is normally effective only within the main emitter region when an N-type emitter region is formed within a P-type gallium region by phosphorus diffusion. The area external of the emitter region, however, does not benefit from the phosphorus gettering, and the lifetime of minority carriers in the external device area is very short, so that the blocking characteristics of the device may be poor.

BRIEF SUMMARY OF THE INVENTION

In accordance with the present invention, a novel high-power controlled rectifier is formed employing gallium diffusion techniques for forming two of the main junctions of the device and with a phosphorus diffusion for forming the emitter region. At the same time that the emitter region is formed, a plurality of phosphorus-doped rings or dots are formed exteriorly of the emitter region and act as gettering regions for raising the minority carrier lifetime of the material from about 5-6 microseconds to 40-50 microseconds.

As a further feature of the invention, two or more different auxiliary gates of different respective firing sensitivity are associated with the auxiliary emitter of the device to enable one to choose a gate either during construction of the device or after its assembly in order to select the necessary sensitivity for a particular application of the device.

BRIEF DESCRIPTION OF THE DRAWINGS

FIG. 1 is a top view of a controlled rectifier employing the novel features of the present invention.

FIG. 1a is an enlarged view of a first gate region of FIG. 1.

FIG. 1b is an enlarged view of a second gate region in FIG. 1.

FIG. 2 is a cross-sectional view of FIG. 1 taken across the section line 2—2 in FIG. 1 and shows the use of shorting dots extending through the emitter layer and phosphorus diffused regions in the wafer surface external of the ring gate electrode.

FIG. 3 is an enlarged cross-sectional view, partly in isometric form, of FIG. 1a taken across the section line 3—3 in FIG. 1a.

FIG. 4 is a top view of FIG. 3 and illustrates the relationship between the main and auxiliary gate metals and the main and auxiliary emitter regions.

DETAILED DESCRIPTION OF THE DRAWINGS

Figure 5:
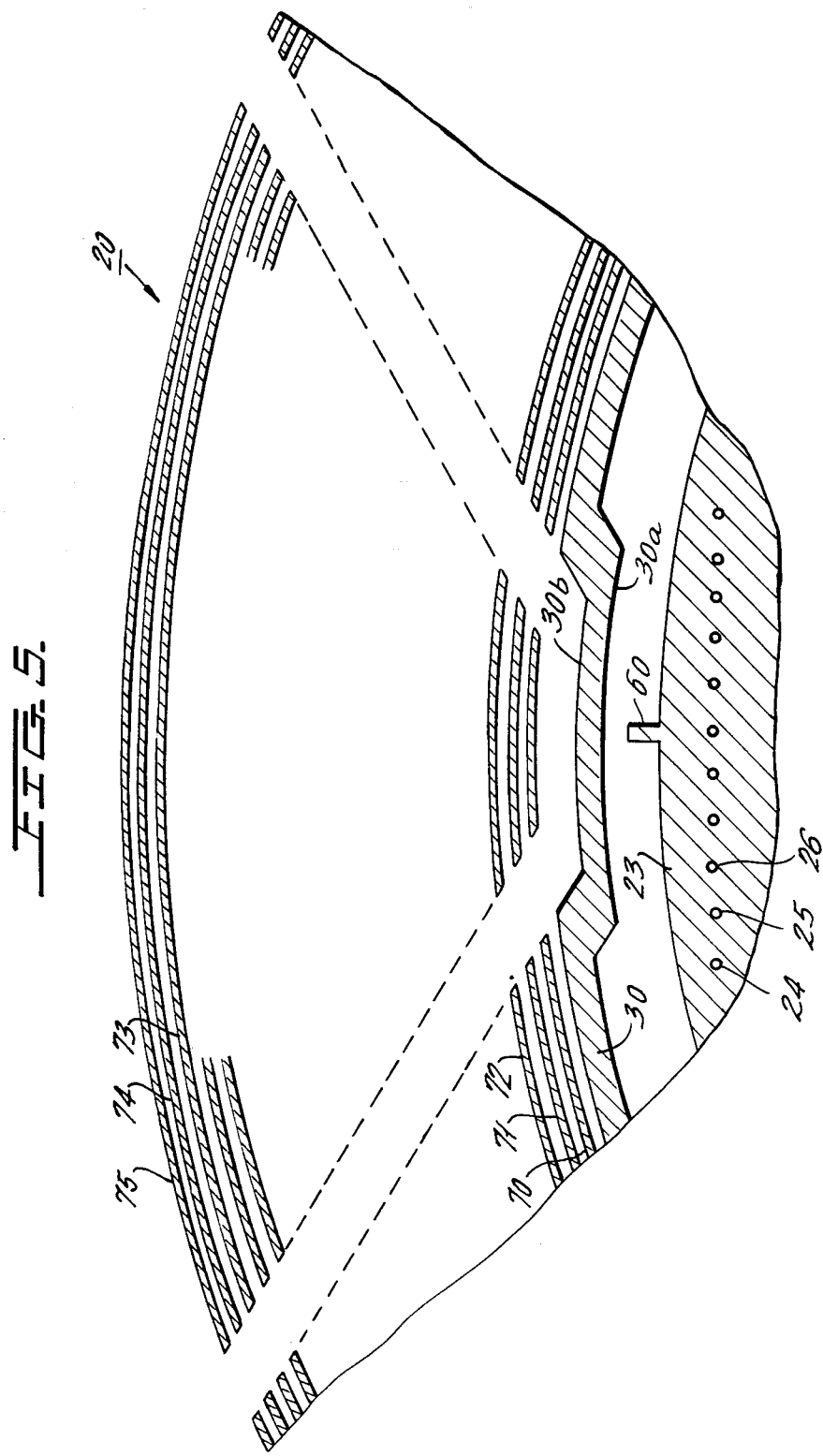
FIG. 5 is a top view of the gate region of FIG. 1a but shows only the phosphorus diffusion which forms the main emitter, auxiliary emitter and gettering rings which are exterior of the gate ring.

Referring to the drawings, there is shown a controlled rectifier which consists of a disc or wafer of monocrystalline silicon 20 which can, for example, have a thickness of 15 mils and a diameter of 900 mils. Obviously, other dimensions can be employed. The wafer can be formed of an initially N-type material and junctions 21 and 22 are formed into the wafer as shown in FIGS. 2 and 3 as by a gallium diffusion or by any other diffusion process desired. A pain emitter region 23 is then formed within the underlying P-type layer using, for example, a phosphorus diffusion.

During the diffusion of the main emitter region 23, a suitable mask can be employed to leave P-type regions or dots such as regions 24, 25 and 26 which extend through the emitter to the upper surface of the wafer 20 in order to short the emitter to the P-type region above junction 22 and thus improve the dV/dt characteristics of the device in the known manner. During the phosphorus diffusion of emitter 23, a ring-shaped auxiliary emitter region 30 is also diffused.

Note that the sequence of junctions described above can be reversed so that there is a P-type emitter, if desired.

A conventional contact 35 is then connected to the bottom or anode region of the device and serves as the anode electrode of the device. The upper main cathode contact consists of the cathode contact 36 which can be formed of any desired conductive disc and adhered to the silicon wafer in any desired manner. A ring gate 37 is also affixed to the surface of the wafer 20 as by soldering or the like, and is spaced from the outer periphery of the cathode disc 36 as is desired. Any desired metallizing system can be used to form the anode, cathode and gate contacts.

As is best shown in FIG. 1, the cathode ring has two exterior notches 40 and 41 (see FIGS. 1a and 1b, respectively), wherein the exterior periphery of notches 40 and 41 straddle the radial thickness of the auxiliary emitter 30 as shown in FIGS. 4 and 5. Auxiliary gate contact 50 and 51 are disposed within the exterior outline of the notches 40 and 41, respectively, and are spaced from the outer periphery of the auxiliary emitter 30 as best shown in FIGS. 3 and 4.

The interior periphery of ring gate 37 then has an inwardly projecting metallic section 55 which is disposed at the center of a line bisecting gate segment 50. A second projection 56 from ring gate 37, shown in FIG. 1, is associated with and bisects the length of auxiliary gate 51. The diffusion pattern of the main emitter 23 then has extending sections which extend under and electrically contact metallic projections 55 and 56 of the gate ring. Thus, as shown in FIGS. 3 and 4, extending section 60 of the main emitter 23 underlies and is in contact with projection 55 from the ring gate 37.

The use of one or more projections, such as projections 55 and 56 which overlap extensions 60 from the main emitter, provide a non-injecting shunt path for the capacitance current between the ring gate 37 and the emitter region 23. As a result of this novel geometry, the device is made substantially less subject to dV/dt turn-on which has previously been caused in ring gate structures.

In particular, with all other structural elements equal, the use of a point connection between the ring gate 37 and emitter region 23 has increased dV/dt turn-on from 150 volts/microsec. to over 4,000 volts/microsec. in a device having a diameter of 0.900 inches.

FIGS. 2, 3 and 5 illustrate a phosphorus diffusion pattern which is applied to the silicon wafer P-type region above junction 22 and exterior of the ring gate. These phosphorus regions serve as a getter for unwanted impurities or defects. Thus, during the diffusion of the emitter pattern, concentric phosphorus rings such as rings 70-75 are diffused completely out to the edge of the device beginning from the auxiliary emitter region 30. If desired, the individual rings 70-75 could be replaced by a dot pattern opposite to the dots 24-26 in the main emitter. Note that the region of auxiliary emitter 30 which is circumferentially removed from gate contacts 50 and 51 has no electrical function, but simply acts as a further phosphorus getter region. Note also that the phosphorus diffusion for making the main and auxiliary emitters (with emitter shorting dots), and the gettering rings 70-75 are formed in a single process step, using a single mask.

The use of the phosphorus rings or equivalent phosphorus dots increases the minority carrier lifetime of the material after gallium diffusion of junctions 21 and 22 from 5-6 microseconds to 40-50 microseconds. This produces an improvement in the blocking and room temperature characteristics of the device.

In the preferred embodiment of the invention, two gate regions are used as shown in FIGS. 1, 1a and 1b. These two gate regions are not identical but differ in their characteristics so that the gates have different sensitivity to turn-on.

Gate sensitivity is determined by the space and thus the resistance between the ends of the gate pads 50 and 51 and the confronting sides of notches 40 and 41, respectively, which contact the underlying P-type material. The distance between the edges of gate 51 from the sides of notch 41 can be made less than the corresponding distance between gate pad 50 and the sides of notch 40. Consequently, the use of gate pad 50 will make the device less sensitive and the use of gate 51 will make it more sensitive. Only one gate lead will be selected for use during assembly of the device, according to the desired specifications of the device.

The present invention was used in a device having the following dimensions: A silicon wafer having a diameter of 1.350" was employed. The radius of the emitter region 23 was 0.479". The radius of the cathode contact was 0.4775" and it was centered on the emitter region. (The outer diameter of the main inner periphery of the auxiliary emitter region 30 was 0.509".) This distance was reduced to 0.500" along peripheral section 30a in FIG. 5. The extension 60 from the main emitter facing section 30a at each gate region was about 0.0015" in width and had a length of about 0.011". (The outer diameter of the auxiliary emitter region 30 was 0.520".) The phosphorus rings 70-75 all had a radial width of about 0.002" and a spacing of about 0.005". The peripheral section 30b in FIG. 5 of the auxiliary emitter cutout had a length of about 0.100". A different length of 0.094" was selected for the other gate region in order to change the sensitivity of that gate region.

The ring gate 37 had an inner diameter of 0.499" and an outer diameter of 0.534". The cutouts generally follow the shape of the peripheral deformations of the auxiliary emitter 30 shown by surfaces 30a and 30b in FIG. 5 such that the outer edge of the gate ring 37 is located at the center of the auxiliary emitter region 30. The projections 55 and 56 from the gate ring had a length of 0.010" and a width of about 0.006". The gates 50 and 51 had dimensions suitable to permit them to fit within the outer periphery of ring gate 37, but their inner peripheries are spaced from the outer peripheral surfaces 30b of the auxiliary emitter 30 by 0.010". The circumferential length of auxiliary gate 50 is about 0.080" with rectangular ends while the circumferential length of auxiliary gate 51 is also 0.080" for its short circumferential leg, but about 0.104" for its outer circumferential length to define the general trapezoidal shape of member 51. The outer periphery of the silicon wafer was tapered in the usual manner.

Obviously, other dimensions can be selected as desired to make devices having other electrical properties. Also, any suitable housing can be used to contain the completed device, as will be apparent to those skilled in the art.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A controlled rectifier having a ring gate; said controlled rectifier comprising a wafer of monocrystalline semiconductor material having generally flat parallel first and second surfaces; said first surface containing a central emitter diffusion region having a generally flat cathode contact secured thereto; said emitter region being of one of the conductivity types; said emitter region being formed in and surrounded at said first surface by a second region which is of the other of the conductivity types; and a ring-shaped gate contact surrounding and radially spaced from the exterior of said central emitter diffusion region and from the exterior of said flat cathode contact; first and second auxiliary emitter regions of said one of said conductivity types formed in said first surface and circumferentially spaced from one another and at least partly underlying the outer periphery of said ring gate and in electrical contact with said ring gate and first and second auxiliary gate contacts connected to said first surface and on said second region; said first and second auxiliary gate contacts being disposed adjacent said first and second auxiliary regions respectively and having portions thereof spaced from said ring gate by different respective distances, whereby said first and second auxiliary gate contacts have different firing sensitivities only one of said first and second gate electrodes being selected for the operation of said controlled rectifier.

2. The device of claim 1, wherein said first and second auxiliary gates have different geometries.

3. The device of claim 1, wherein said ring gate has first and second circumferentially spaced cut-out regions extending into its outer periphery; said first and second auxiliary gates being nested into said first and second cut-out regions respectively.

4. The device of claim 2, wherein said ring gate has first and second circumferentially spaced cutout regions extending into its outer periphery; said first and second auxiliary gates being nested into said first and second cut-out regions respectively.

5. The controlled rectifier of claims 1, 2, 3 or 4, wherein said emitter region is circular and wherein said ring gate is circular.

6. The controlled rectifier of claims 1, 2, 3 or 4, which includes an anode contact connected to said second surface.

7. The device of claim 1, wherein said ring gate contact has a short peripheral portion thereof electrically connected to a short peripheral portion of the outer periphery of said central emitter diffusion region.

8. A controlled rectifier having a ring gate; said controlled rectifier comprising a wafer of monocrystalline semiconductor material having generally flat parallel first and second surfaces; said first surface containing a central emitter diffusion region having a generally flat cathode contact secured thereto; said emitter region being of one of the conductivity types; said emitter region being formed in and surrounded at said first surface by a second region which is of the other of the conductivity types; and a ring-shaped gate contact surrounding and radially spaced from the exterior of said central emitter diffusion region and from the exterior of said flat cathode contact; said second region being a gallium-diffused region; said emitter region being a phosphorus diffused region; and a plurality of spaced phosphorus diffused regions extending into said second region in areas external of the outer periphery of said ring gate which serve as gettering regions to increase minority carrier lifetime in said second region external of said ring gate.

9. The device of claim 8 in which said spaced phosphorus diffused regions are concentric rings.

10. The device of claim 8 is in which said spaced phosphorus diffused regions are spaced dots.

11. The device of claim 8, 9 or 10 which further includes first and second auxiliary emitter regions of said one of said conductivity types formed in said first surface and circumferentially spaced from one another and at least partly underlying the outer periphery of said ring gate and in galvanic contact with said ring gate; and first and second auxiliary gate contacts connected to said first surface and on said second region; said first and second auxiliary gate contacts being adjacent said first and second auxiliary regions respectively and spaced from said ring gate by different respective distances, whereby said first and second auxiliary gate contacts have different firing sensitivities, only one of said first and second gate contacts being selected for the operation of said controlled rectifier.

12. The device of claim 11, wherein said ring gate has a short peripheral portion thereof electrically connected to a short peripheral portion of the outer periphery of said central emitter diffusion region.

* * * * *